United States Patent
de Rooij et al.

(10) Patent No.: US 10,243,546 B2
(45) Date of Patent: Mar. 26, 2019

(54) ENHANCEMENT MODE FET GATE DRIVER IC

(71) Applicant: Efficient Power Conversion Corporation, El Segundo, CA (US)

(72) Inventors: Michael A. de Rooij, Palm Springs, CA (US); David C. Reusch, Blacksburg, VA (US); Suvankar Biswas, Blacksburg, VA (US)

(73) Assignee: Efficient Power Conversion Corporation, El Segundo, CA (US)

( * ) Notice: Subject to any disclaimer, the term of this patent is extended or adjusted under 35 U.S.C. 154(b) by 0 days.

(21) Appl. No.: 15/605,219

(22) Filed: May 25, 2017

(65) Prior Publication Data

US 2017/0346475 A1    Nov. 30, 2017

Related U.S. Application Data

(60) Provisional application No. 62/341,318, filed on May 25, 2016.

(51) Int. Cl.
| | |
|---|---|
| H03K 3/00 | (2006.01) |
| H03K 17/04 | (2006.01) |
| H01L 27/088 | (2006.01) |
| H01L 29/20 | (2006.01) |
| H03K 3/0233 | (2006.01) |
| H03K 19/0185 | (2006.01) |

(Continued)

(52) U.S. Cl.
CPC ....... *H03K 17/0406* (2013.01); *H01L 27/088* (2013.01); *H01L 29/2003* (2013.01); *H03K 3/02337* (2013.01); *H03K 17/063* (2013.01); *H03K 17/223* (2013.01); *H03K 19/018507* (2013.01); *H01L 27/0605* (2013.01)

(58) Field of Classification Search
None
See application file for complete search history.

(56) References Cited

U.S. PATENT DOCUMENTS

| | | |
|---|---|---|
| 4,724,342 A | 2/1988 | Sato et al. |
| 5,742,196 A | 4/1998 | Fronen et al. |

(Continued)

FOREIGN PATENT DOCUMENTS

| | | |
|---|---|---|
| CN | 104348461 A | 2/2015 |
| CN | 103915990 B | 5/2016 |

OTHER PUBLICATIONS

Texas Instruments, "LM5114 Single 7.6-A Peak Current Low-Side Gate Drive", SNVS790F—Jan. 2012—Revised Nov. 2015.

(Continued)

*Primary Examiner* — Long Nguyen
(74) *Attorney, Agent, or Firm* — Blank Rome LLP

(57) ABSTRACT

A fully integrated GaN driver comprising a digital logic signal inverter, a level shifter circuit, a UVLO circuit, an output buffer stage, and (optionally) a FET to be driven, all integrated in a single package. The level shifter circuit converts a ground reference 0-5 V digital signal at the input to a 0-10 V digital signal at the output. The output drive circuitry includes a high side GaN FET that is inverted compared to the low side GaN FET. The inverted high side GaN FET allows switch operation, rather than a source follower topology, thus providing a digital voltage to control the main FET being driven by the circuit.

6 Claims, 15 Drawing Sheets

(51) Int. Cl.
  *H03K 17/06* (2006.01)
  *H03K 17/22* (2006.01)
  *H01L 27/06* (2006.01)

(56) References Cited

U.S. PATENT DOCUMENTS

| | | | |
|---|---|---|---|
| 9,007,117 B2 | 4/2015 | Weis et al. | |
| 9,525,413 B2 | 12/2016 | Roberts et al. | |
| 2011/0025397 A1 | 2/2011 | Wang et al. | |
| 2012/0286365 A1* | 11/2012 | Hosokawa | H02M 3/1588 257/369 |
| 2016/0079978 A1* | 3/2016 | Kinzer | H02J 7/0052 326/68 |
| 2016/0079979 A1* | 3/2016 | Kinzer | H02J 7/0052 323/312 |
| 2016/0105173 A1 | 4/2016 | de Rooij et al. | |
| 2016/0301408 A1 | 10/2016 | Roberts et al. | |

OTHER PUBLICATIONS

GaN Systems, "How to Drive GaN Enhancement Mode Power Switching Transistors", 2009—2014 GaN Systems Inc., GN001 Rev Oct. 21, 2014, pp. 1-13.

A. Bindra, "Selecting Gate Driver ICs for Gallium Nitride FETs", https://www.digikey.com/en/articles/techzone/2015/jan/selecting-gate-driver-ics-for-gallium, Jan. 13, 2015.

Z. Chen et al., "A 12A 50V Half-Bridge Gate Driver for Enhancement-Mode GaN HEMTs with Digital Dead-Time Correction", 2015 IEEE, pp. 1750-1753.

Y. Long et al., "A High-Frequency Resonant Gate Driver for Enhancement-Mode GaN Power Devices", 2015 IEEE, pp. 1961-1965.

Y. Xi et al., "Optimization of the Drive Circuit for Enhancement Mode Power GaN FETs in DC-DC Converters", 2012 IEEE, pp. 2467-2471.

* cited by examiner

ENHANCEMENT MODE FET GATE DRIVER IC

This application claims the benefit of U.S. Provisional Application No. 62/341,318, filed on May 25, 2016, the disclosure of which is incorporated by reference herein.

BACKGROUND OF THE INVENTION

1. Field of the Invention

The present invention relates to gate drivers and, more particularly, to an integrated circuit for driving low-side enhancement mode Gallium Nitride (GaN) FETs.

2. Description of the Related Art

High power GaN transistors have recently been introduced as a replacement for silicon based transistors. GaN offers superior performance over silicon-based devices due to the high electron mobility and high breakdown field of gallium nitride, resulting in low on-resistance, fast switching and higher operating temperatures. Normally-off enhancement mode GaN transistors are preferred as they are fast (majority carriers, unlike depletion mode), have no reverse recovery ($Q_{RR}$) and consume less power than depletion mode devices.

Gate drivers for enhancement mode GaN transistors are available from Texas Instruments, such as the LM5114 Low-Side Gate Driver. However, the LM5114 itself is made on a silicon process that is not compatible with GaN. This prevents monolithic integration of the enhancement mode GaN transistor to be driven. The two chip solution does not allow the lowest possible gate loop circuit inductance, and therefore cannot compete with the performance of a fully monolithically integrated solution. A gate driver integrated with the enhancement mode GaN transistor will necessarily have a much lower propagation delay, will consume less power, and will allow a very short on-time duration.

U.S. Pat. No. 9,525,413 proposes an integrated solution, i.e., an enhancement mode GaN transistor with a monolithically integrated GaN driver comprising two smaller enhancement mode GaN transistors in a half bridge configuration. The high side GaN transistor of the half bridge provides the gate drive voltage to the gate of the GaN transistor, and the low side GaN transistor clamps the gate of the GaN switch to the source. This solution requires a discrete dual voltage pre-driver. For the reasons mentioned above, it would be advantageous to integrate the enhancement mode GaN transistor with a complete gate driver in a single integrated package.

In particular, it would be desirable to provide a fully integrated GaN driver that can operate from a single 5V supply, has low power consumption, with no severe limitations on duty cycle and frequency, has fast transitions, low propagation time, and has a pull-up and pull-down resistance matched to the FET it drives, and includes UVLO circuitry.

SUMMARY OF THE INVENTION

The present invention achieves the above-noted goals by providing a fully integrated GaN driver with the above-noted features that can support pulses down to 10 ns. Such a low pulse capability opens the door to very high frequency converters >10 MHz and also high step down ratio converters such as 48 V to 1 V or less.

More specifically, the present invention provides a fully integrated GaN driver comprising a digital logic signal inverter, a level shifter circuit, a UVLO circuit, an output buffer stage, and (optionally) a FET to be driven, all integrated in a single package or chip.

The output drive circuitry includes a high side GaN FET that is inverted compared to the low side GaN FET. The inverted high side GaN FET allows switch operation, rather than a source follower topology, thus providing a digital voltage to control the main FET being driven by the circuit.

The fully integrated GaN gate driver of the present invention also includes a novel low voltage "level shifter" and "current amplifier." The input is a ground reference 0-5 V digital signal, and the output is a 0-10 V digital signal. This signal is useful for the inverted output drive stage discussed above.

Other features and advantages of the present invention will become apparent to those skilled in the art when the following description is read in conjunction with the accompanying drawings.

DETAILED DESCRIPTION OF THE PREFERRED EMBODIMENTS

In the following detailed description, reference is made to exemplary embodiments of the present invention. The exemplary embodiments are described with sufficient detail to enable those skilled in the art to practice them. It is to be understood that other embodiments may be employed and that various structural, logical, and electrical changes may be made.

The basic building blocks of a gate driver are a logic inverter, a signal level shifter, and an output drive stage. An undervoltage lockout (UVLO) circuit is also desirable to shut down the gate driver if the source voltage drops below a predetermined threshold value.

Figure 1:
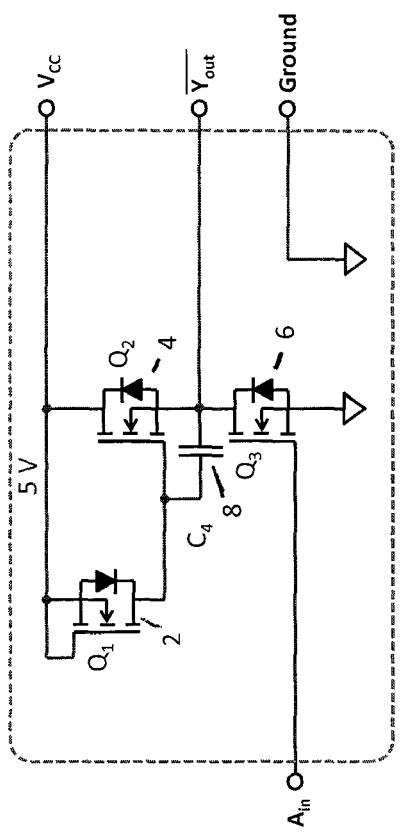
FIG. 1 is a schematic of a preferred embodiment of the digital logic signal inverter of the present invention.

FIG. 1 is a schematic of a preferred embodiment of the digital logic signal inverter of the present invention. In GaN, the supply voltage is 5 V, so a logic high is 5 V and a logic low is 0 V. The inverter of the present invention is similar to standard NMOS logic inverters with some notable exceptions: a) transistor 4 (Q2; $w_G$=10 μm) is an enhancement mode GaN transistor, not a depletion mode device as is typical in NMOS, b) because no depletion mode device is used, transistor 2 (Q1; $w_G$=20 μm), also an enhancement mode GaN transistor, is added to charge the gate of transistor 4 (Q2), thereby keeping it on. Transistor 6 (Q3; $w_G$=120 μm) is also an enhancement mode GaN transistor—the on-resistance of transistor 6 (Q3) is six times lower than the on-resistance of Q2.

The logic inverter of the present invention works by using transistor 2 (Q1) as a bootstrap diode (gate shorted to source) with $C_{GS}$ of transistor 4 (Q2), which makes for faster transitions. The diode charges the gate of transistor 4 (Q2) ($C_{GS}$) and capacitor 8 (C4=0.2 pF) to nearly 5 V when transistor 6 (Q3) is on, i.e. input (Ain) logic of 1 (5V), and thus transistor 4 (Q2) is always on and conducting current. This allows fast voltage rise. Transistor 4 (Q2) dissipates most of the power on the IC. Since the drain of transistor 6 (Q3) is also connected to the output ($\overline{Y_{out}}$) the output will be near 0 V thus inverting the input. In this mode, transistor 6 (Q3), being a large FET, pulls transistor 4 (Q2) out of saturation and thus has a current flowing through it. This current is needed when the input signal changes to 0 V to pull the output high, again inverting the logic input. The capacitor 8 (C4) is used for extra storage above that provided by $C_{GS}$ of transistor 4 (Q2), thus increasing the time the circuit can "hold" a logic high output. The primary advantage of the logic inverter of the present invention is that only N-type, enhancement-mode only FETs are used.

Figure 2:
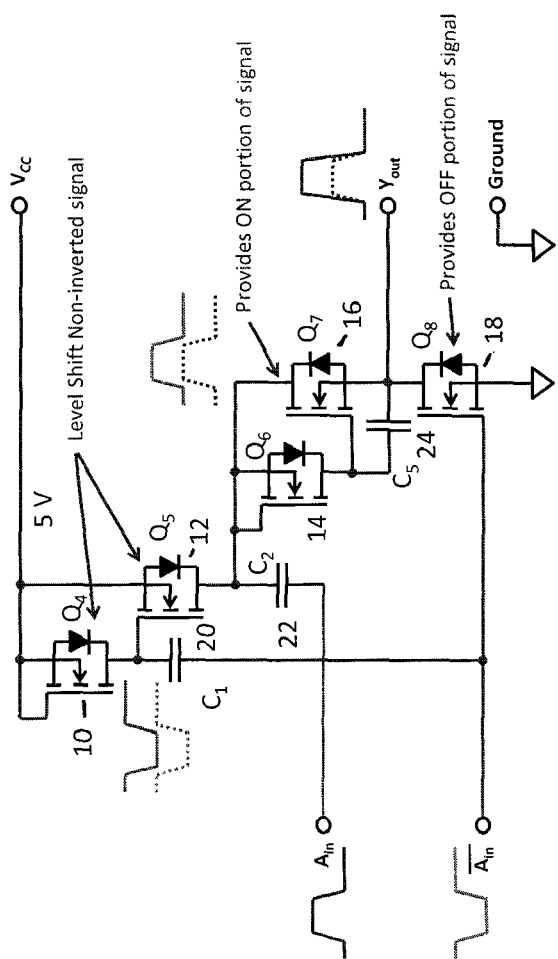
FIG. 2 is a schematic diagram of a preferred embodiment of the level shifter of the present invention.

FIG. 2 is a schematic diagram of a preferred embodiment of the level shifter of the present invention. The main function of the level shifter to increase the voltage magnitude of the input ($A_{in}$) by a factor of two for the logic high only. A logic low input of 0 V remains 0 V. This circuit uses two inputs where the second is simply an inverted version of $A_{in}$. This can be done using the inverter described previously.

The level shifter of the present invention works in essentially the same manner as the inverter circuit plus a few modifications. It comprises two stages: (1) a supply voltage level shifter transistors 10 (Q4) and 12 (Q5); and (2) an inverter and high voltage buffer stage made up of transistors 14 (Q6), 16 (Q7) and 18 (Q8). The second stage works in the same manner as the logic inverter except its supply voltage is 10 V, not 5 V (drain of transistor 16 (Q7)) when the output is high (Yout) and 5 V when the output is low (where it operates exactly the same as the inverter). The first stage works as a bootstrap supply where the voltage across capacitor 20 (C1=5 pF) level shifts the inverted input signal from between 0 V and 5 V to between 5 V and 10 V. Transistor 10 (Q4) acts as diode in this case allowing transistor 12 (Q5) to switch with 0 V (off) and 5 V (on) across its gate. Capacitor 22 (C2=50 pF) is charged when $A_{in}$ is low, which is also when transistor 12 (Q5) is turned on through C1. Transistors 10 (Q4; $w_G$=10 μm), 12 (Q5; $w_G$=50 μm), 14 (Q6; $w_G$=10 μm), 16 (Q7; $w_G$=10 μm) and 18 (Q8; $w_G$=60 μm) are each preferably enhancement mode GaN transistors. The gate widths provided herein are exemplary only—it is the ratios between them that are important. Capacitor 24 (C5) is 2 pF.

Figure 3:
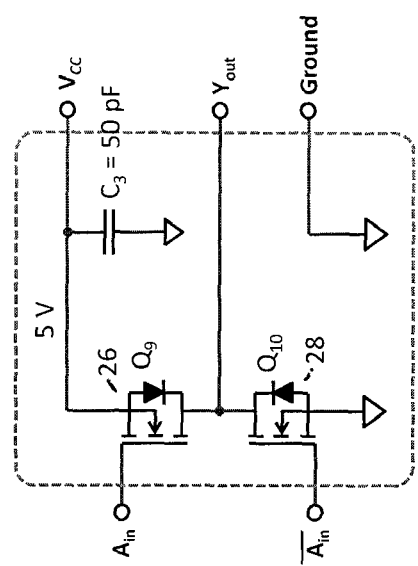
FIG. 3 is the output buffer stage of the gate driver.

FIG. 3 is the output buffer stage of the gate driver. It uses two complimentary inputs ($A_{in}$ and $\overline{A_{in}}$). Note that the output drive circuitry includes a high side enhancement mode GaN FET 26 (Q9) ($w_G$=1.2 mm), Q5, that is inverted compared to the low side enhancement mode GaN FET 28 (Q10) ($w_G$=1.2 mm). The inverted high side GaN FET 26 (Q9) allows switch operation, rather than a source follower topology, thus providing a digital voltage to control the main FET being driven by the circuit.

More specifically, when the logic input $A_{in}$ is low (0 V) and $\overline{A_{in}}$ is high (5 V), transistor 28 (Q10) is turned on thus making the output (Yout) low (0 V). Also, the upper FET gate of transistor 26 (Q9) becomes highly reverse biased (a unique feature of GaN FETs that increases the "body diode" voltage), such that it cannot conduct despite being installed in reverse (drain and source). When the logic input $A_{in}$ is high (10 V) from the level shifter stage and $\overline{A_{in}}$ is low, transistor 26 (Q9) is turned on and transistor 28 (Q10) is off. This stage significantly increases the current sink or source capability of the driver.

Figure 4:
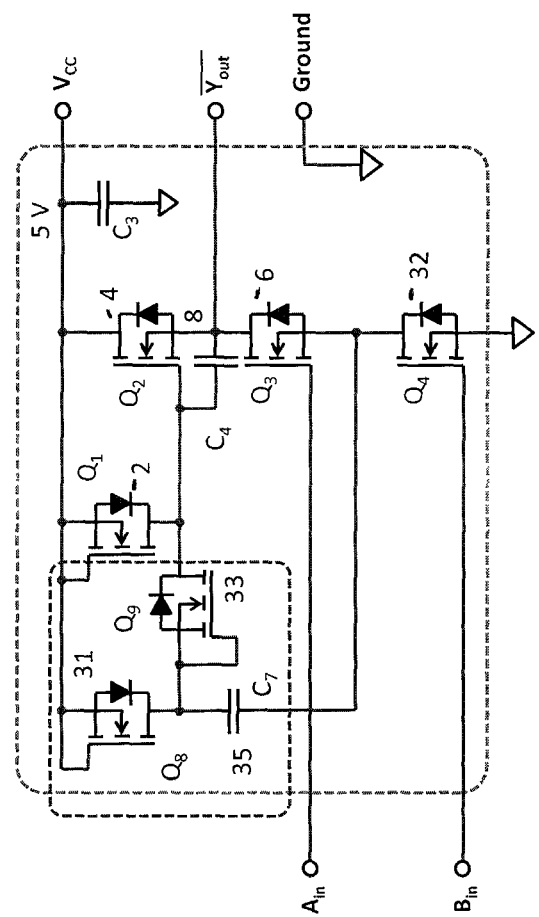
FIG. 4 is an implementation of a two input NAND logic.

FIG. 4 is an implementation of a two input NAND logic. It is based on the logic inverter described earlier, with one minor exception. The input FET is divided into two for the two inputs and their connections cascaded. This requires both FETs 6 and 32 (Q3 and Q4) to be ON before it can conduct and change the state of transistor 4 (Q2) and hence the output, thus yielding a NAND gate. Transistors 2 (Q1; $w_G$=10 μm), 4 (Q2; $w_G$=20 μm), 6 (Q3; $w_G$=120 μm) and 32 (Q4; $w_G$=120 μm) are all enhancement mode GaN transistors. Transistor 2 (Q1) is used as a diode to charge capacitor 8 (C4) when both transistors 6 and 32 (Q3 and Q4) are turned on. This prevents capacitor 8 (C4) from properly charging when either of transistors 6 and 32 (Q3 and Q4) is held off and would severely degrade the performance of the output. Transistors 31 (Q8; $w_G$=10 μm), 33 (Q9) and capacitor 35 (C7) correct this problem. The circuit works by allowing capacitor 35 (C7) to charge when transistor 32 (Q4) is on and transistor 8 (Q3) is off. When transistor 32 (Q3) is turned on, capacitor 35 (C7) can charge capacitor 8 (C4) via transistor 33 (Q9; $w_G$=10 μm), thus restoring operation to the circuit.

Figure 5:
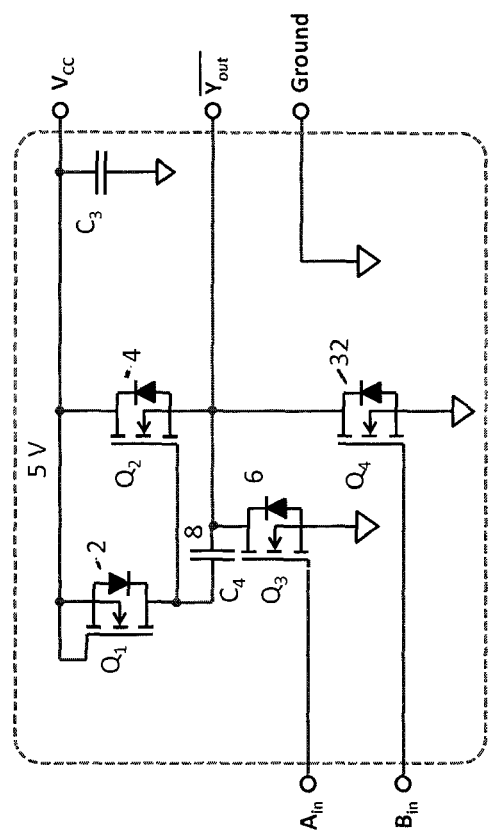
FIG. 5 is an implementation of a two input NOR logic.

FIG. 5 is an implementation of a two input NOR logic. It is based on the logic inverter of FIG. 1 described earlier with one minor exception. The input FET is divided into two for the two inputs and their connections are paralleled. This requires either of the two FETs 6 and 32 (Q3 & Q4) to be ON to change the state of Q2 and hence the output, thus yielding a NOR gate.

Figure 6:
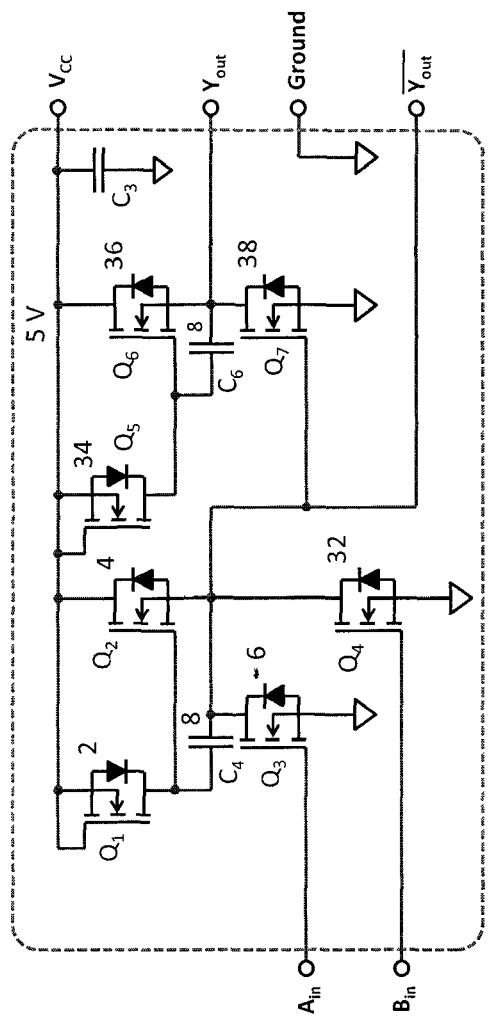
FIG. 6 is an implementation of a two input OR Logic.

FIG. 6 is an implementation of a two input OR Logic. It is based on the NOR logic of FIG. 5, with an inverter stage added on the end to change the polarity. Transistors 34 (Q5; $w_G$=10 μm), 36 (Q6; $w_G$=20 μm), and 38 (Q7; $w_G$=120 μm) are analogous to transistors 2 (Q1), 4 (Q2) and 6 (Q3), and are all enhancement GaN transistors.

Figure 7:
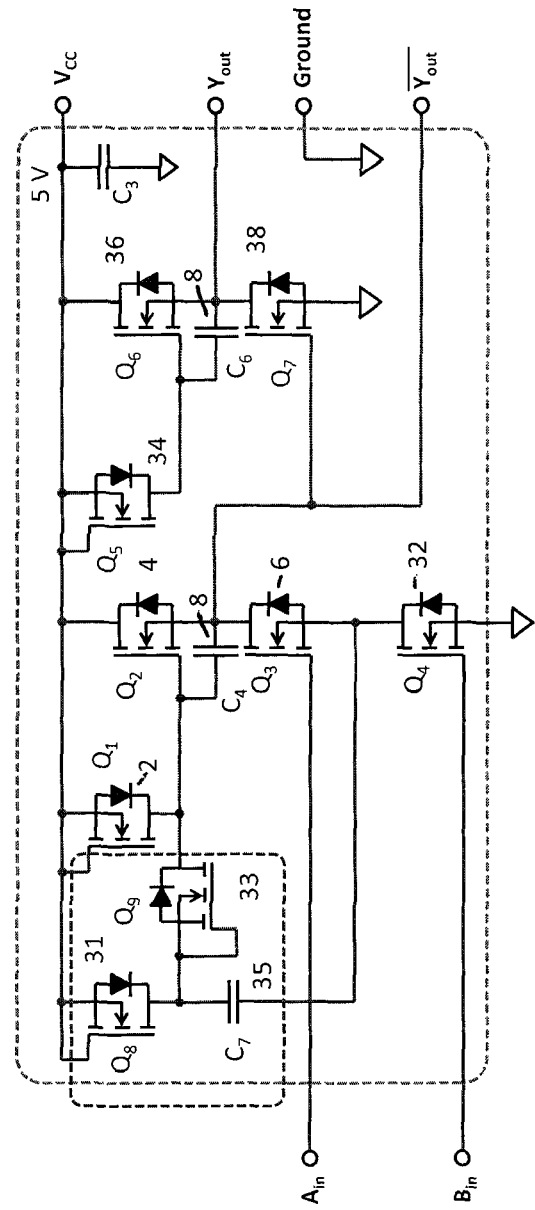
FIG. 7 is an implementation of a two input AND logic.

FIG. 7 is an implementation of a two input AND logic. It is based on the NAND logic of FIG. 4, with an inverter stage added on the end to change the polarity.

Figure 8:
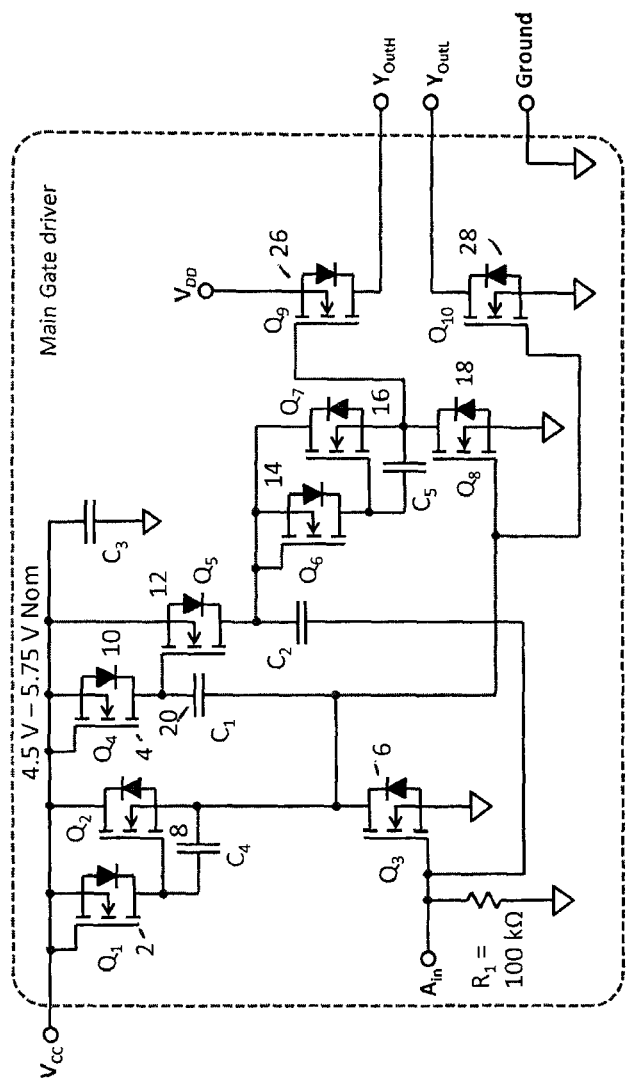
FIG. 8 is the circuit of the complete standalone gate driver.

FIG. 8 is the circuit of the complete gate driver. It comprises the three stages described earlier: (1) Inverter (FIG. 1), (2) Level shifter (FIG. 2), and (3) output buffer (FIG. 3). Also, the output stage is opened to yield $Y_{outH}$ and $Y_{outL}$. This allows external programming of gate resistors for the driver to independently change the turn on and off characteristics of the FET being driven, thus improving matching for smaller FETs (being driven).

Figure 9:
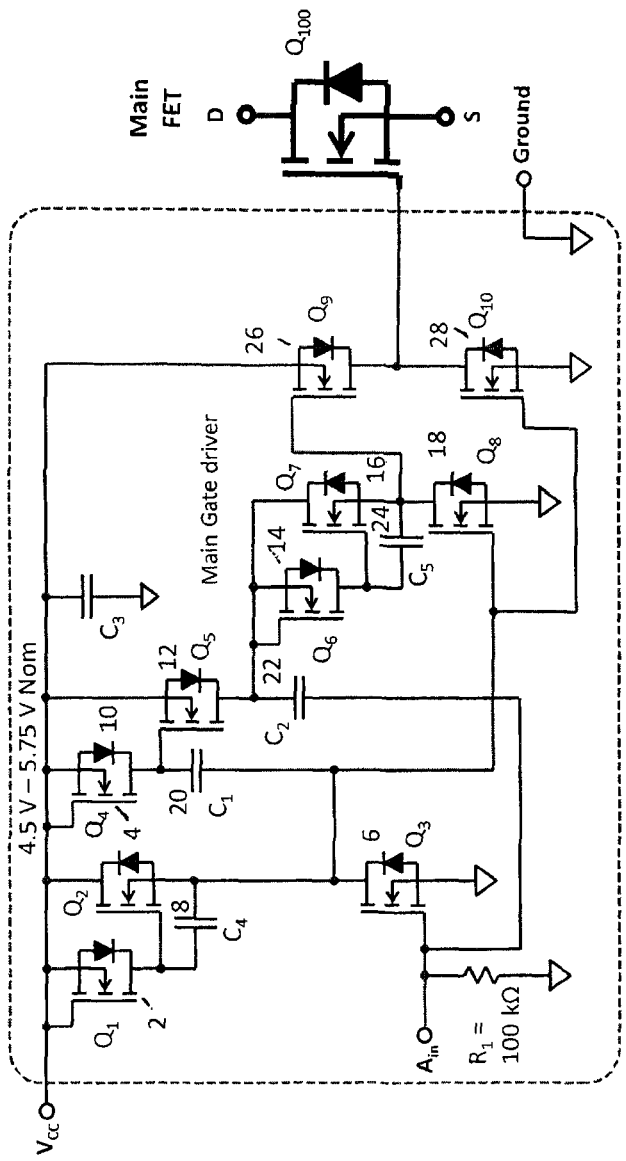
FIG. 9 is the circuit of the complete gate driver in which the main FET to be driven is integrated with the driver.

FIG. 9 is the circuit of the complete gate driver in which the main FET to be driven is integrated with the driver. It is the same design as the complete driver of FIG. 8, except that the output stage is connected to the main FET (Q100; $w_G$=300 mm). This eliminates external programming of the FET voltage as the driver has already been optimized to the FET it drives.

As mentioned previously, it is desirable to provide the gate driver with an undervoltage lockout (UVLO) circuit. The UVLO circuit of the present invention comprises two voltage reference circuits and a comparator. One of the voltage reference circuits compares a pre-determined voltage against the measured supply voltage, and the other voltage reference circuit is used for the constant current source of the comparator.

Figure 10:
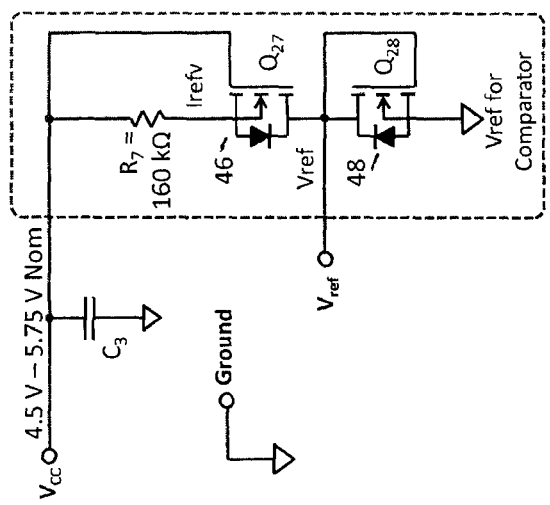
FIG. 10 shows a basic voltage reference circuit which incorporates only N-type, enhancement-mode GaN FETs.

FIG. 10 shows the basic voltage reference circuit, which incorporates only N-type, enhancement-mode GaN FETs. The reference comprises transistor 46 (Q27; $w_G$=10 μm), resistor 44 (R27=160 kΩ, the current set resistance) and transistor 48 (Q28 $w_G$=10 μm). With the gate of transistor 48 (Q28) connected to its drain, transistor 48 (Q28) becomes a limited voltage reference when sinking a current. Any attempt to increase the voltage above the threshold of the FET results in an increase in sink current by transistor 48 (Q28). Transistors 46 (Q27) and 48 (Q28) are preferably EPC25V Scalable enhancement mode GaN transistors with a gate width of 10 μm.

Figure 11:
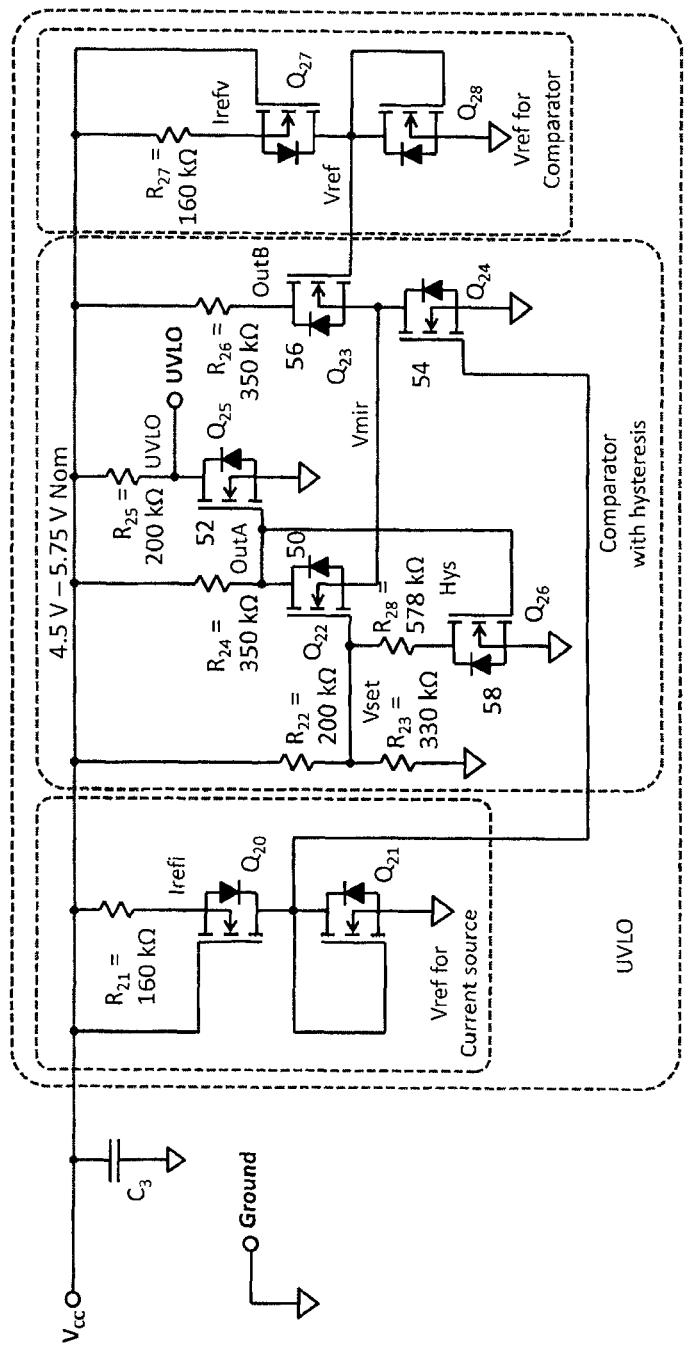
FIG. 11 shows the basic Under Voltage LockOut (UVLO) circuit of the present invention.

FIG. 11 shows the basic Under Voltage LockOut (UVLO) circuit of the present invention. The purpose of the UVLO circuit is to lockout/prevent operation of another circuit if the supply voltage is below a pre-determined value. Once the pre-determined supply voltage is reached, the UVLO circuit releases the other circuit (in this case, the gate driver circuit) for operation. This prevents the GaN FETs of the gate driver from being operated below their threshold voltage in many power switching applications. The UVLO circuit comprises three parts: (1) a voltage reference (pre-determined voltage) to be compared against the measured supply voltage, (2) a voltage reference used for the constant current source of the comparator, (3) a comparator stage. The two voltage reference circuits are the same as discussed previously and shown in FIG. 10. One reference is used as a fixed reference for comparison to the supply voltage by the comparator and the second reference is used as a fixed reference to generate the current mirror in the comparator. The comparator is the classic current mirror type. Transistor 58 (Q26) in the comparator is used to add hysteresis to the circuit that prevents oscillation. The UVLO output is set by transistor 52 (Q25) as a digital logic signal. Transistors 50 (Q22), 52 (Q25), 54 (Q24), 56 (Q23) and 58 (Q26) are all preferably EPC25V Scalable enhancement mode GaN transistors with gate width of 10 μm.

Figure 12:
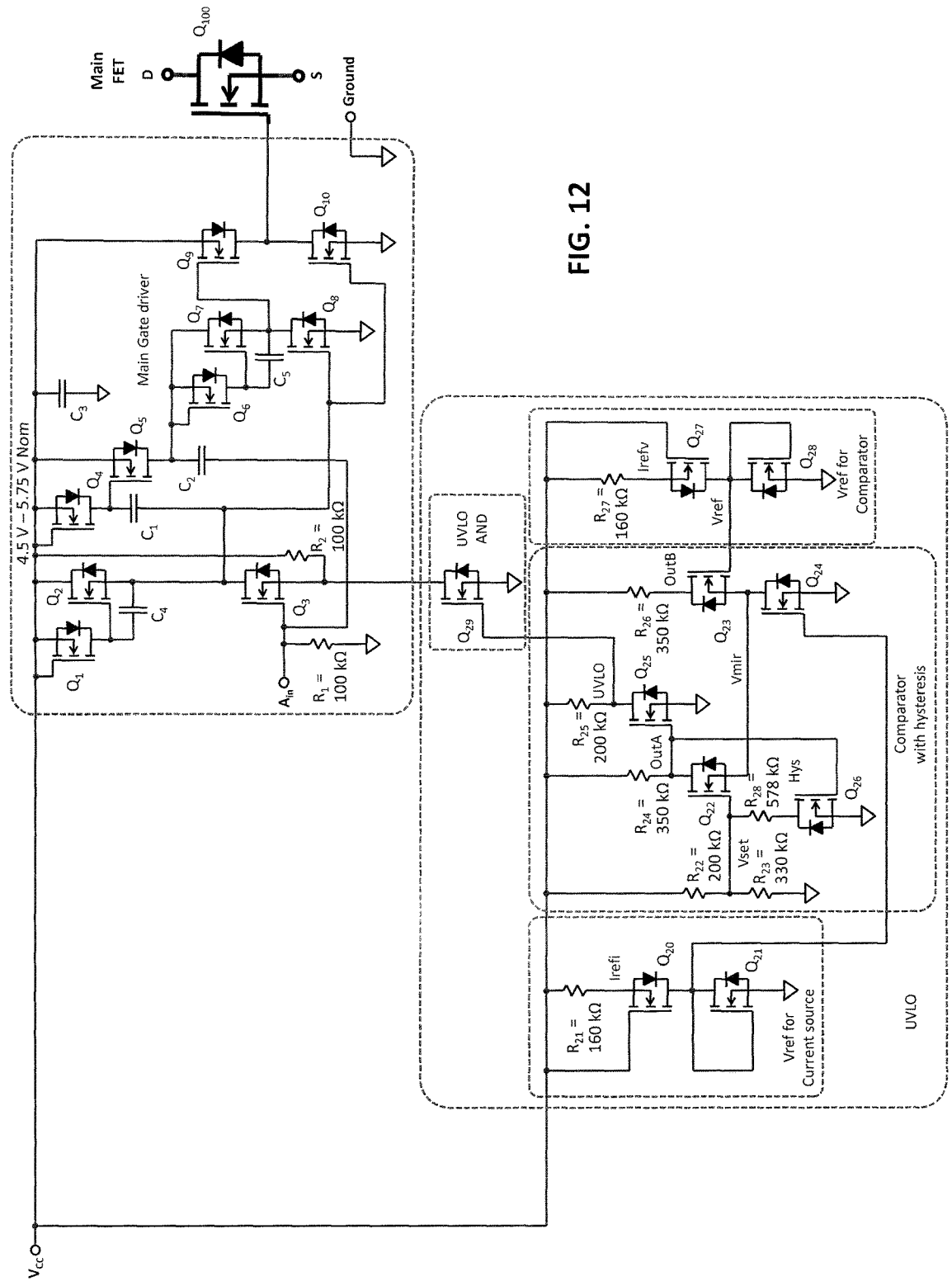
FIG. 12 shows the gate driver of the present invention including the above-described ULVO circuitry, integrated with the main FET.

FIG. 12 shows the complete standalone gate driver of the present invention including the above-described ULVO circuitry, integrated with the main FET. The main FET in FIG. 12 is an EPC2019 enhancement mode GaN FET or equivalent—the circuit described herein has been optimized to drive this type of FET. However, the gate drive circuit of the present invention can obviously be integrated with (and optimized for driving) other main FETs.

Figure 13:
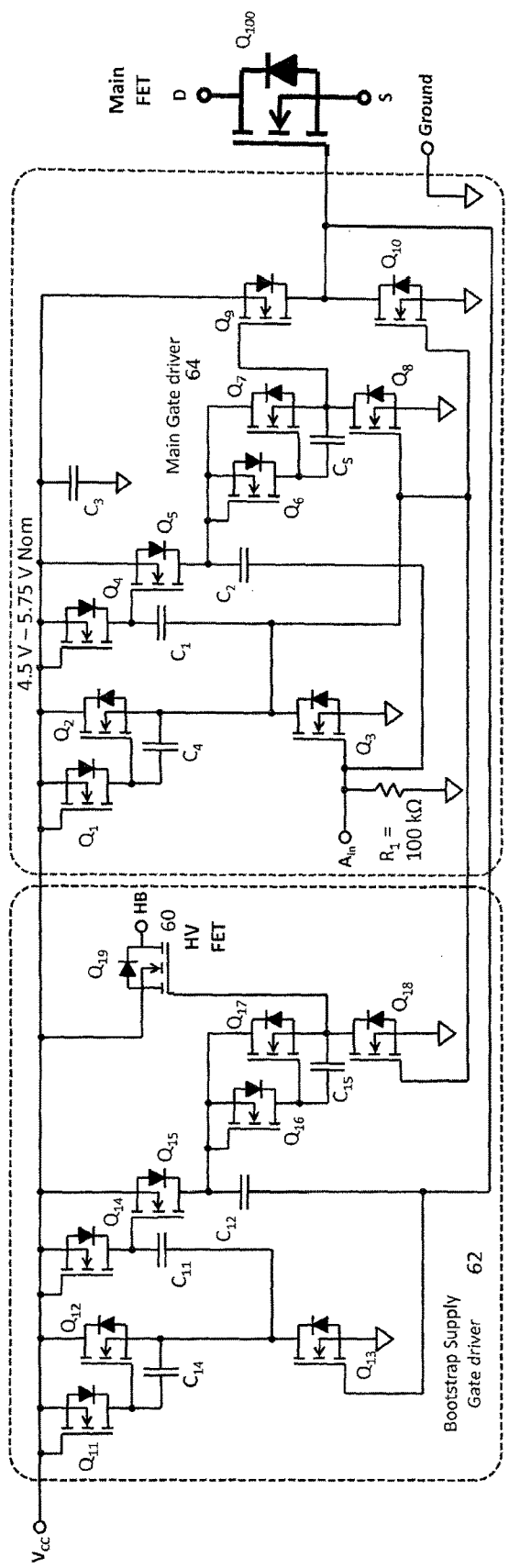
FIG. 13 shows the main gate driver of the present invention (without UVLO) including synchronous bootstrap supply FET circuitry.

FIG. 13 shows a version of the basic gate driver (without UVLO) that includes a gate driver and an FET 60 (Q19) for a synchronous bootstrap supply. The synchronous bootstrap supply FET voltage rating should be at least 5 V higher than the main FET as the HB node includes a charge voltage for the bootstrap supply of 5 V.

The synchronous bootstrap FET supply gate driver circuit 62 of FIG. 13 is nearly identical to the main FET gate driver circuit 64, except it does not require the final output buffer stage. The main reasons for this are: (1) The synchronous bootstrap FET requires a +5 V and −5 V across the gate which is produced by the +10 V and 0 V output of the low voltage level shifter; and (2) the synchronous bootstrap FET is very small so it does not require significant current o drive. The 5 V offset is provided by the source of the synchronous bootstrap FET source being connected to the 5 V supply. This solution does not require an external circuit typical of the classic enhancement mode GaN FET synchronous bootstrap supply (see, e.g., U.S. Patent Application Publication No. 2016/0105173), as the timing and level shifting are taken care of internally.

Timing for the gate driver of FIG. 13 is achieved in two stages: (1) Turn on must be delayed from the main FET being turned on to allow the main FET to fully enhance. This is achieved using the main FET gate signal as the signal source for the synchronous bootstrap FET gate driver; and (2) Turn off must be together or sooner that the main FET. This is achieved by using the initial inverted signal of the main gate driver to drive transistor Q18 directly, thus bypassing the synchronous bootstrap FET driver. This signal effectively arrives on the synchronous bootstrap FET before it reaches the main FET.

Figure 14:
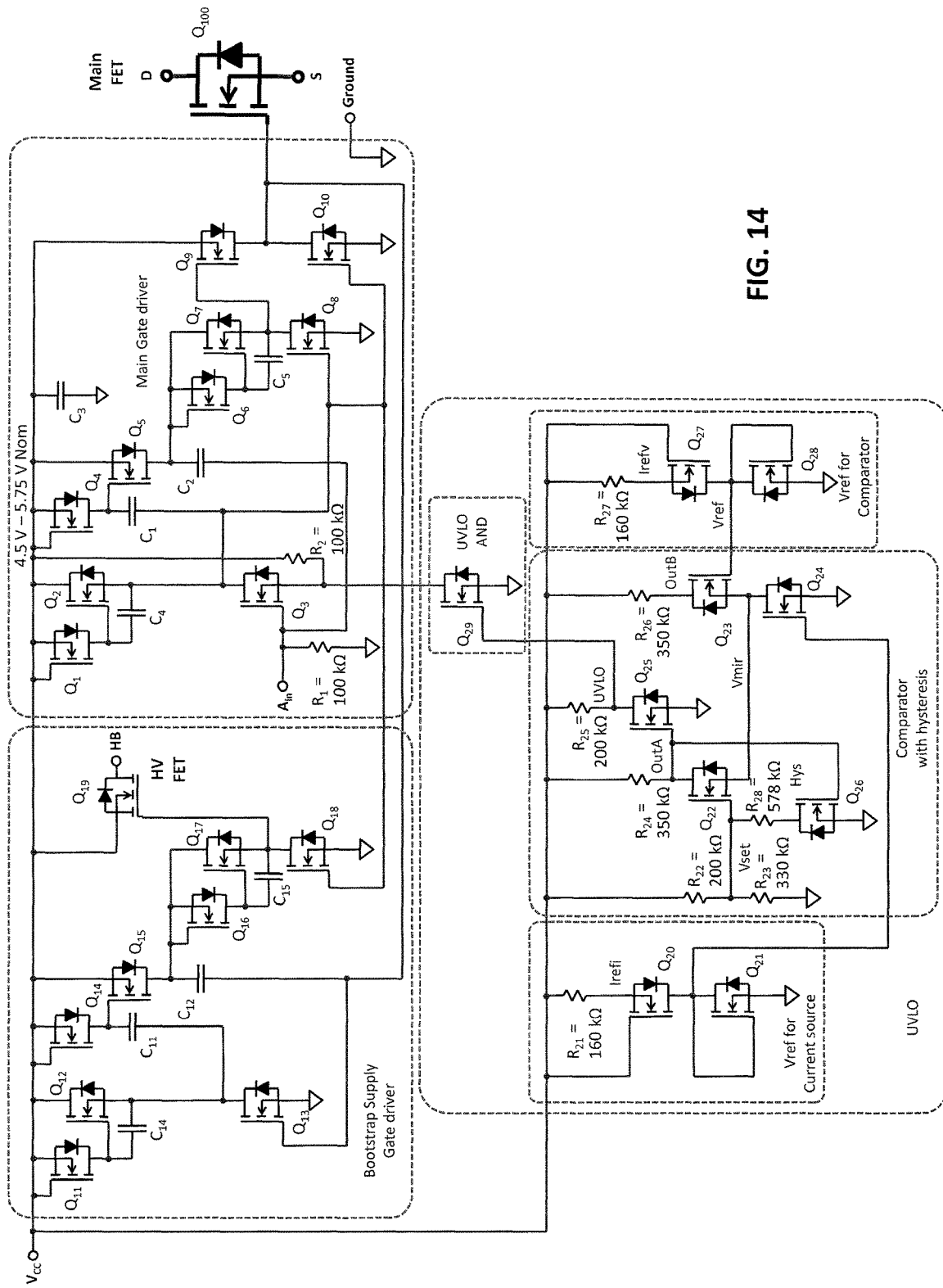
FIG. 14 shows the complete gate driver of the present invention, incorporating all of the previously described features, including UVLO, integrated synchronous bootstrap FET, the main driver, and the main FET.

FIG. 14 shows the complete gate driver of the present invention, incorporating all of the previously described features, including UVLO, integrated synchronous bootstrap FET, the main driver, and the main FET.

Figure 15:
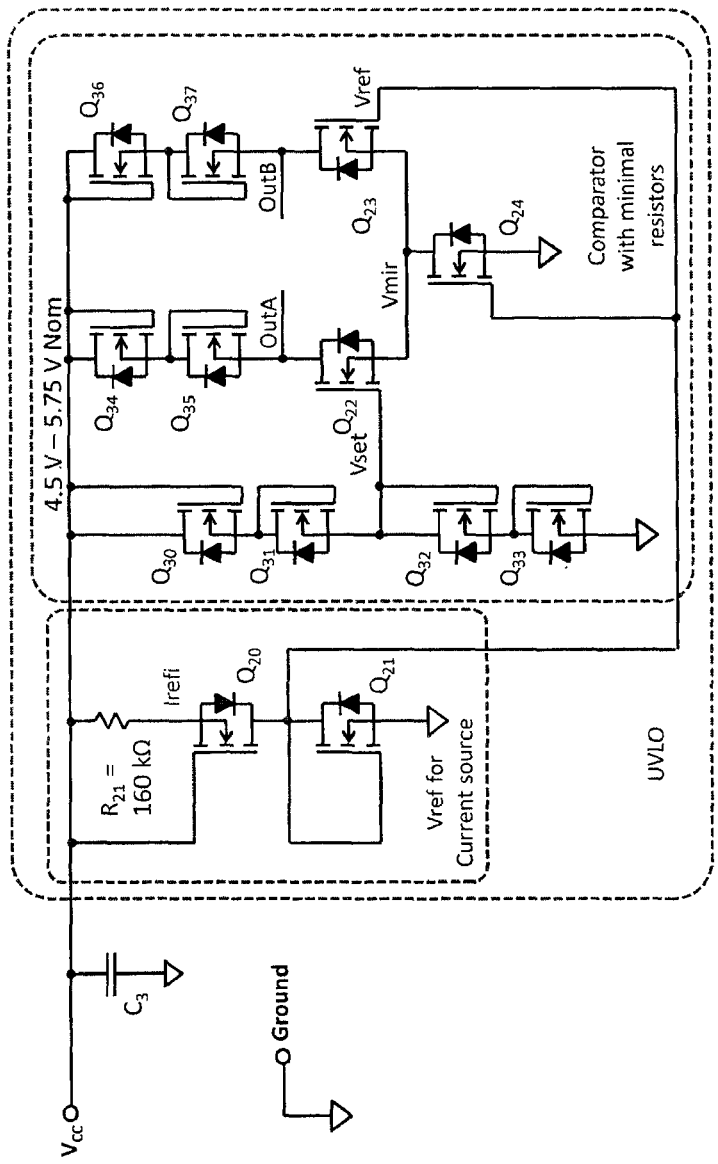
FIG. 15 shows an alternate embodiment of the comparator/UVLO circuit.

FIG. 15 shows an alternate embodiment of the comparator/UVLO circuit. In the embodiment of FIG. 11, resistors are used for loads. In the GaN process, resistors occupy a lot a room physically on the die and come with large tolerance variations (~20%), all undesirable characteristics. In the embodiment of FIG. 15, many of the resistors are replaced with enhancement mode GaN FETs, where the gate is tied to the drain, making the enhancement mode GaN FETs non-linear resistors. The tolerances between the GaN FETs are significantly tighter and they also take up significantly less area on the die. In FIG. 15, the FET loads are used for the voltage sense for the UVLO as well as loads for the current mirror circuit.

The above description and drawings are only to be considered illustrative of specific embodiments, which achieve the features and advantages described herein. Modifications and substitutions to specific process conditions can be made. Accordingly, the embodiments of the invention are not considered as being limited by the foregoing description and drawings.

What is claimed is:

1. An integrated gate driver circuit for driving an enhancement mode GaN field effect transistor, comprising the following elements fully integrated in a single chip:
  a gate driver, comprising:
    a first logic inverter circuit;
    a supply voltage level shifter circuit having an input and an output, the supply voltage level shifter circuit converting a ground reference 0-5 V digital signal at the input to a 0-10 V digital signal at the output, the supply voltage level shifter comprising two stages:
      a first stage which acts as a bootstrap supply, comprising an enhancement mode GaN transistor with a source terminal connected to a gate terminal and to the supply voltage, the enhancement mode GaN transistor acting as a diode to charge a bootstrap capacitor; and a second stage comprising a second logic inverter circuit with a supply of 10 V when its output is high and a supply of 5 V when its output is low; and an output stage; and an undervoltage lockout circuit connected to the gate driver, comprising:

a voltage reference circuit for generating a predetermined voltage reference; and a comparator for receiving the output of the voltage reference circuit and for preventing operation of the gate driver if the supply voltage falls below said predetermined voltage reference.

2. The integrated gate driver circuit of claim 1, wherein all transistors in the integrated gate driver circuit are enhancement mode GaN field-effect transistors.

3. An integrated circuit comprising the integrated gate driver circuit of claim 2, integrated with the enhancement mode GaN field-effect transistor to be driven.

4. The integrated gate driver circuit of claim 1, wherein the output stage comprises a half bridge circuit formed of a high side enhancement mode GaN transistor and a low side enhancement mode GaN transistor, with the high side enhancement mode GaN transistor inverted relative to the low side enhancement mode GaN transistor.

5. The integrated gate driver circuit of claim 1, further comprising a synchronous bootstrap FET supply gate driver circuit.

6. The integrated gate driver circuit of claim 5, wherein the synchronous bootstrap FET supply gate driver circuit is substantially the same as the gate driver without the output stage.

* * * * *